(12) United States Patent
Iwasaki et al.

(10) Patent No.: US 10,559,586 B2
(45) Date of Patent: Feb. 11, 2020

(54) SEMICONDUCTOR MEMORY DEVICE

(71) Applicant: TOSHIBA MEMORY CORPORATION, Tokyo (JP)

(72) Inventors: Taichi Iwasaki, Yokkaichi Mie (JP); Takeshi Sonehara, Yokkaichi Mie (JP); Hiroyuki Nitta, Kuwana Mie (JP)

(73) Assignee: Toshiba Memory Corporation, Tokyo (JP)

( * ) Notice: Subject to any disclaimer, the term of this patent is extended or adjusted under 35 U.S.C. 154(b) by 34 days.

(21) Appl. No.: 15/909,432

(22) Filed: Mar. 1, 2018

(65) Prior Publication Data
US 2019/0006384 A1 Jan. 3, 2019

(30) Foreign Application Priority Data

Jun. 28, 2017 (JP) ................. P2017-126501

(51) Int. Cl.
*H01L 27/11582* (2017.01)
*H01L 27/11521* (2017.01)
(Continued)

(52) U.S. Cl.
CPC ...... *H01L 27/11582* (2013.01); *H01L 23/562* (2013.01); *H01L 23/585* (2013.01); *H01L 27/11521* (2013.01); *H01L 27/11526* (2013.01); *H01L 27/11556* (2013.01); *H01L 27/11565* (2013.01); *H01L 27/11568* (2013.01); *H01L 27/11573* (2013.01); *H01L 21/0217* (2013.01); *H01L 21/02164* (2013.01); *H01L 21/02236* (2013.01); *H01L 21/02255* (2013.01); *H01L 21/02271* (2013.01); *H01L 21/26513* (2013.01);
(Continued)

(58) Field of Classification Search
CPC ......... H01L 27/11582; H01L 27/11521; H01L 27/11526; H01L 27/11565; H01L 23/562
See application file for complete search history.

(56) References Cited

U.S. PATENT DOCUMENTS 8,742,596 B2 6/2014 Hirano
9,691,784 B2 6/2017 Saito et al.
(Continued)

FOREIGN PATENT DOCUMENTS

| JP | 2012-204443 A | 10/2012 |
|---|---|---|
| JP | 2016-58454 A | 4/2016 |
| JP | 2017-055097 A | 3/2017 |

*Primary Examiner* — Marc Anthony Armand
(74) *Attorney, Agent, or Firm* — Kim & Stewart LLP

(57) ABSTRACT

A semiconductor memory device includes a semiconductor layer having a termination region surrounding a device region, the termination region including a first stacked body having a first, insulating, layer located on a surface of the substrate, a second, conductive, layer located over the first layer, and a third, insulating, layer located over the second layer, an opening extending through the first stacked body, a fourth, insulating, layer located in the opening in the first stacked body and over the surface of the semiconductor substrate in the opening, a fifth, insulating, layer located over the fourth layer, and a wall surrounding the device region, the wall extending inwardly of the opening and contacting one of the surface of the semiconductor substrate or a nitride material on the surface of the substrate, wherein the composition of the third and fifth layers is different from that of the first and third layers.

11 Claims, 10 Drawing Sheets

(51) Int. Cl.
*H01L 27/11526* (2017.01)
*H01L 27/11556* (2017.01)
*H01L 27/11568* (2017.01)
*H01L 27/11573* (2017.01)
*H01L 23/00* (2006.01)
*H01L 27/11565* (2017.01)
*H01L 23/58* (2006.01)
*H01L 21/78* (2006.01)
*H01L 27/11519* (2017.01)
*H01L 29/788* (2006.01)
*H01L 29/792* (2006.01)
*H01L 29/10* (2006.01)
*H01L 21/02* (2006.01)
*H01L 21/3205* (2006.01)
*H01L 21/265* (2006.01)
*H01L 21/3105* (2006.01)
*H01L 21/311* (2006.01)
*H01L 21/768* (2006.01)
*H01L 21/321* (2006.01)

(52) U.S. Cl.
CPC ... *H01L 21/31053* (2013.01); *H01L 21/31116* (2013.01); *H01L 21/3212* (2013.01); *H01L 21/32053* (2013.01); *H01L 21/32055* (2013.01); *H01L 21/7684* (2013.01); *H01L 21/76816* (2013.01); *H01L 21/76846* (2013.01); *H01L 21/78* (2013.01); *H01L 27/11519* (2013.01); *H01L 29/1037* (2013.01); *H01L 29/7883* (2013.01); *H01L 29/7889* (2013.01); *H01L 29/7926* (2013.01)

(56) References Cited

U.S. PATENT DOCUMENTS

| | | |
|---|---|---|
| 2016/0268166 A1 | 9/2016 | Nakajima |
| 2017/0069657 A1 | 3/2017 | Hamanaka et al. |
| 2018/0301374 A1* | 10/2018 | Masamori ......... H01L 27/11582 |
| 2018/0331118 A1* | 11/2018 | Amano ................ H01L 23/485 |

* cited by examiner

SEMICONDUCTOR MEMORY DEVICE

CROSS-REFERENCE TO RELATED APPLICATION

This application is based upon and claims the benefit of priority from. Japanese Patent Application No. 2017-126501, filed Jun. 28, 2017, the entire contents of which are incorporated herein by reference.

FIELD

Embodiments described herein relate generally to a semiconductor memory device.

BACKGROUND

In recent years, a stacked semiconductor memory device in which memory cells are three-dimensionally arranged has been developed. In such a stacked semiconductor memory device, a stacked body includes electrode films and insulating films that are alternately stacked on each other on a semiconductor substrate, and a semiconductor pillar penetrates through the stacked body. At each intersection of the electrode film and the semiconductor pillar, a memory cell is formed. An end portion of the stacked body is processed in a stepwise shape and a contact is connected to each electrode film from above.

Around the stacked body, a peripheral circuit is formed. Also, a contact is connected from above to a gate and the like of a transistor in a peripheral circuit. Further, on the semiconductor substrate, a frame shaped edge seal surrounds the stacked body and the peripheral circuit. The edge seal is made of metal and prevents intrusion of moisture and propagation of crack present in an external environment. In such a stacked semiconductor memory device, it is desirable to reduce manufacturing cost.

DETAILED DESCRIPTION

Embodiments provide a semiconductor memory device with lowered manufacturing cost.

In general, according to one embodiment, a semiconductor memory device includes a semiconductor layer comprising a termination region surrounding a device region thereof, the termination region comprising a first stacked body extending around the device region and comprising a first layer composed of an insulating material located on a surface of the substrate, a second layer composed of a conductive material located over the first layer, and a third layer composed of an insulating material located over the second layer, an opening extending through the first stacked body and extending around the device region, a fourth layer, composed of an insulating material, located in the opening in the first stacked body and over the surface of the semiconductor substrate in the opening, a fifth layer, composed of an insulating material, located over the fourth layer, and a wall surrounding the device region, the wall extending inwardly of the opening and contacting one of the surface of the semiconductor substrate or a nitride material on the surface of the substrate, wherein the composition of the third and fifth layers is different from that of the first and third layers.

First Embodiment

Hereinafter, a first embodiment will be described.

Figure 1:
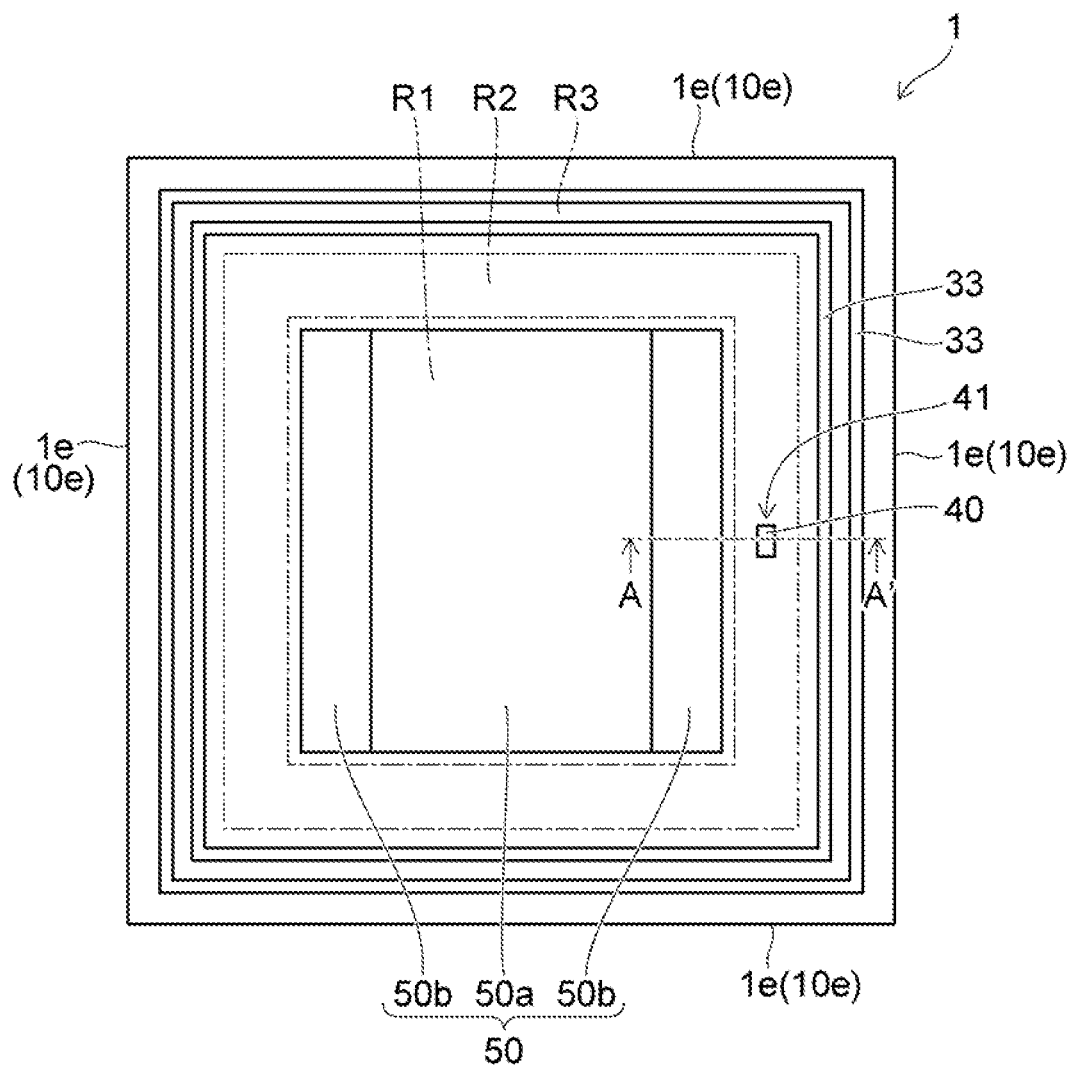
FIG. 1 is a plan view of a semiconductor memory device according to a first embodiment.

FIG. 1 is a plan view of a semiconductor memory device according to the embodiment.

Figure 2:
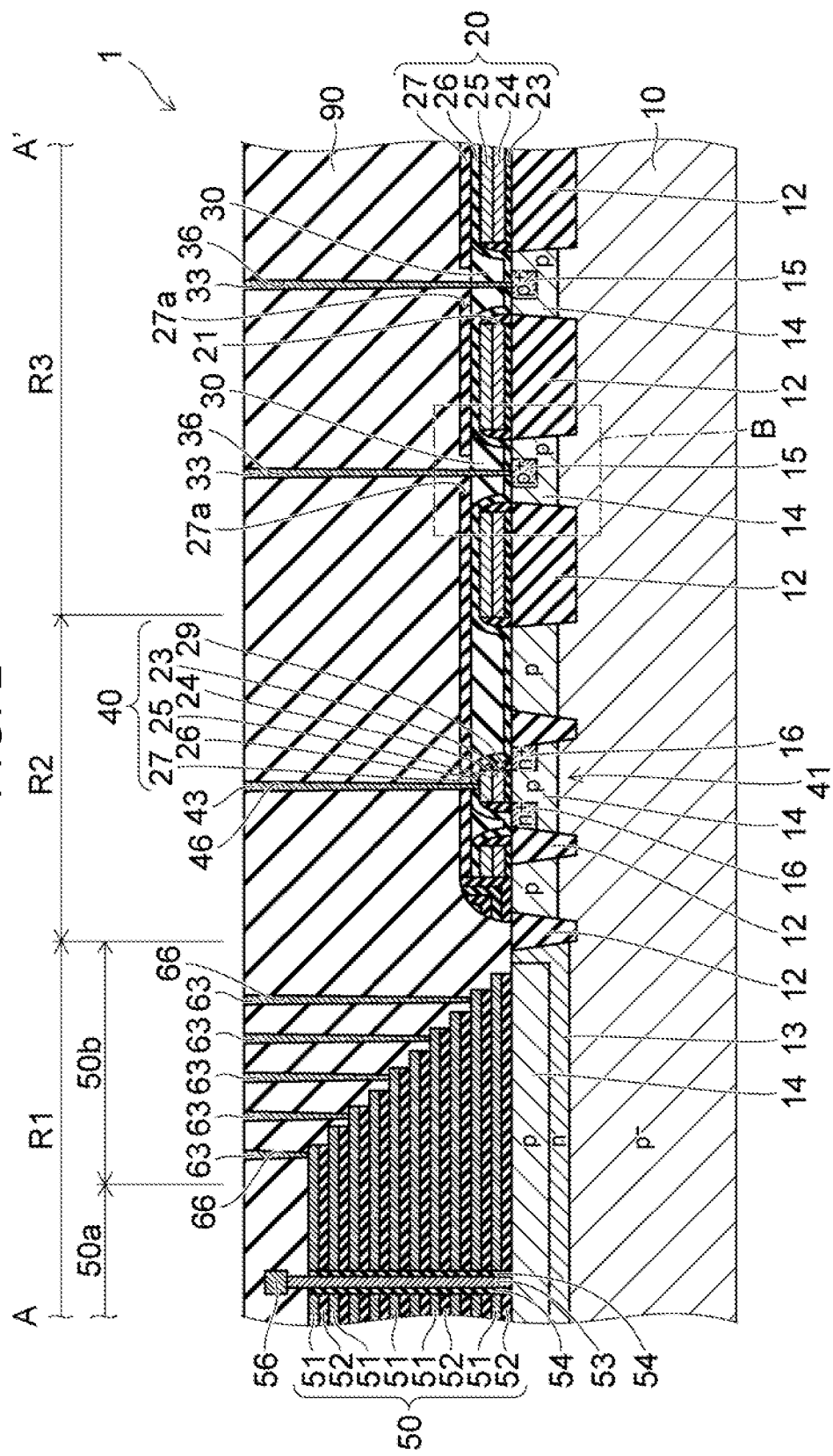
FIG. 2 is a sectional view taken along line A-A' illustrated in FIG. 1.

FIG. 2 is a sectional view taken along line A-A' illustrated in FIG. 1.

Figure 3:
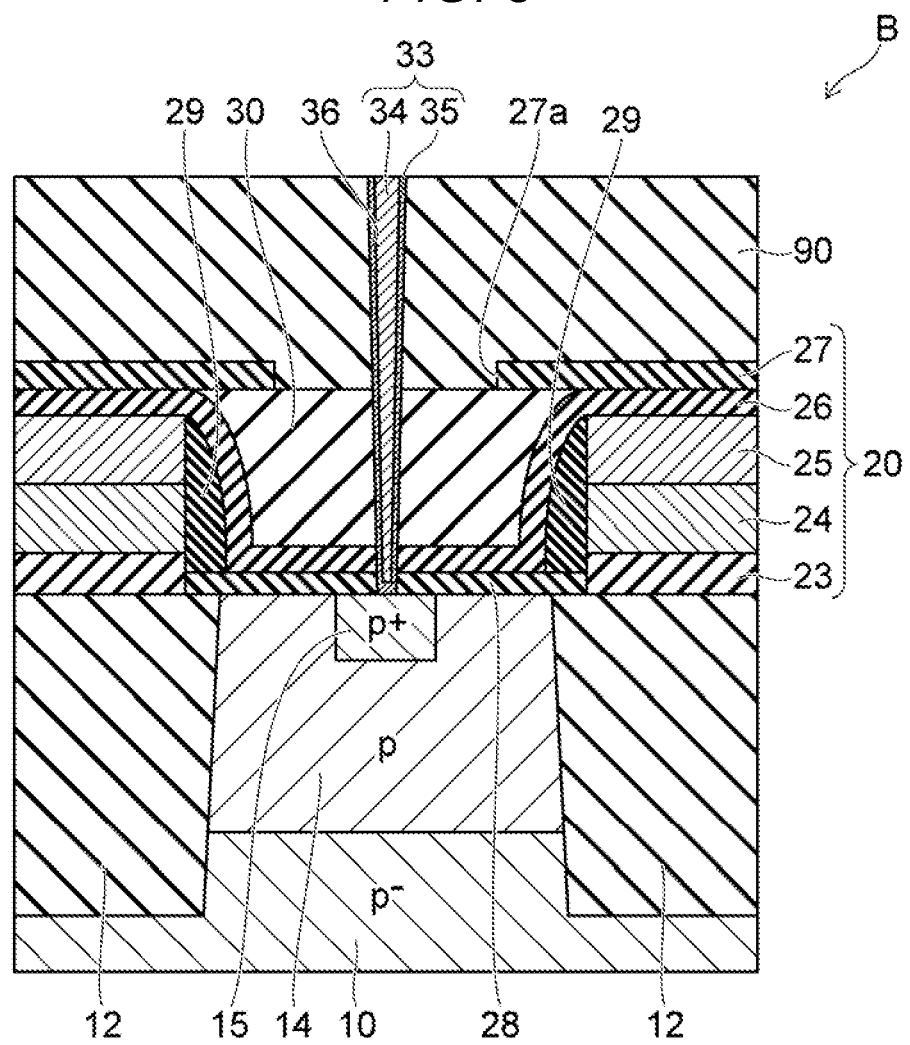
FIG. 3 is a partially enlarged sectional view illustrating an area B of FIG. 2.

FIG. 3 is a partially enlarged sectional view illustrating an area B of FIG. 2.

It is noted that each view is schematic. For example, each element may be drawn to be smaller or larger than its actual size. Among the many views, the number, the dimension and the like of elements may not always coincide with one another.

The semiconductor memory device according to the embodiment is a stacked NAND flash memory.

As illustrated in FIGS. 1 and 2, a semiconductor memory device 1 according to the embodiment is provided with a silicon substrate 10. The shape of the silicon substrate 10 is a rectangular plate shape. The silicon substrate 10 is provided thereon with an interlayer insulating film 90 made of silicon oxide ($SiO_2$).

In the specification, the "silicon substrate" refers to a substrate containing silicon (Si) as a main component thereof. This is also similar to other elements, and when the name of an element includes a material name, the element contains the material as a main component. In general, since silicon is a semiconductor material, unless otherwise specified, the silicon substrate is a semiconductor substrate. This is also similar to other members, and the characteristics of the members reflect characteristics of a main component in principle. For example, a "silicon oxide film" is an insulating film containing silicon oxide as a main component. Further, in the specification, for the purpose of convenience, a direction toward the interlayer insulating film 90 from the silicon substrate 10 is defined as "up" and an opposite direction thereof is defined as "down".

In the semiconductor memory device 1, a memory cell region R1 is located at a center portion thereof, i.e., interiorly of the termination region along the surface of the substrate 10. When viewed from above, the shape of the memory cell region R1, for example, is a rectangular shape. Further, a frame shaped peripheral circuit region R2 surrounds the memory cell region R1. Moreover, a frame shaped termination region R3 surrounds the peripheral circuit region R2 and extends along an edge region extending inwardly from the edge 1e of the semiconductor substrate 10. The termination region R3 includes the edge 1e of the semiconductor memory device 1.

At a plurality of portions of an upper layer portion of the silicon substrate 10, a STI (Shallow Trench Isolation: device isolation insulating film) 12 made of, for example, silicon oxide is provided. Further, at a part of a region in the upper layer portion of the silicon substrate 10 with no STI, an n-type well 13 and a p-type well 14 are formed. A designated conductivity type of each part in the specification is an example, and the disclosure is not limited thereto. For example, instead of the n-type well 13, a p-type well may be provided, or instead of the p-type well 14, an n-type well may be provided.

As illustrated in FIGS. 2 and 3, in the termination region R3, a termination stacked body 20 is provided on the silicon substrate 10. In the termination stacked body 20, a silicon oxide film 23, a polysilicon film 24, a tungsten silicide (WSi) film 25, a silicon nitride (SiN) film 26, and a silicon nitride film 27 are sequentially stacked from the substrate up. The silicon oxide film 23, for example, is formed by thermally oxidizing an upper surface of the silicon substrate 10, and is in contact with the silicon substrate 10. In a region of the silicon substrate 10 directly under the termination stacked body 20, for example, the STI regions 12 are disposed.

The termination stacked body 20 is formed with a frame shaped opening 21 along, and extending inwardly of, the edge 10e of the silicon substrate 10 to extend around the edge region of the silicon substrate 10. In a region of the silicon substrate 10 directly under the opening 21, the p-type well 14 is formed, and at a central upper portion of the p-type well 14, a p$^+$-type contact layer 15 is formed. Instead of the p$^+$-type contact layer 15, an n$^+$-type contact layer may be provided, or both the p$^+$-type contact layer and the n$^+$-type contact layer may be provided. When viewed from above, the shapes of the p-type well 14 and the p$^+$-type contact layer 15 are frame shapes in the edge region and extend along and inwardly of the edge 10e of the silicon substrate 10. In the opening 21 at the upper surface of the silicon substrate 10, a silicon oxide film 28 is formed. On the silicon oxide film 28 and at side surfaces of the silicon oxide film 23, the polysilicon film 24, and the tungsten silicide film 25, a sidewall 29 made of silicon nitride is provided.

The silicon nitride film 26 extends inwardly of the opening 21 along a surface of the sidewall 29 and across the upper surface of the silicon oxide film 28. On the silicon nitride film 26 in the opening 21, a silicon oxide film 30 is provided. The silicon nitride film 27 extends inwardly of the sides of the opening 21 along an upper surface of the silicon oxide film 30. Accordingly, the silicon oxide film 30 is disposed between portions of the silicon nitride film 26 and the silicon nitride film 27. The silicon nitride film 27 does not cover the center portion of the opening 21 in a width direction, and is formed with an opening 27a.

On the silicon nitride film 27 and the portion of the silicon oxide film 30 spanning the opening 27a, the interlayer insulating film 90 is disposed to cover the termination stacked body 20 and the silicon oxide film 30. An edge seal 33 extending in an up and down direction passes through the interlayer insulating film 90, the silicon oxide film 30, the silicon nitride film 26, and the silicon oxide film 28 in order. The edge seal 33 is in contact with the interlayer insulating film 90, the silicon oxide film 30, the silicon nitride film 26, the silicon oxide film 28, and the p$^+$-type contact layer 15. On the other hand, as the edge seal 33 extends through the opening 27a of the silicon nitride film 27, it is separated from the silicon nitride film 27.

When viewed from above, the shape of the edge seal 33 is a rectangular frame shape along the edge 10e (see FIG. 1) of the silicon substrate 10. A lower end of the edge seal 33 is connected to the silicon substrate 10 through the p$^+$-type contact layer 15. In the edge seal 33, a body portion 34 made of, for example, tungsten (W) is provided, and a barrier metal layer 35 in which a titanium nitride (TiN) layer and a titanium (Ti) layer are stacked is provided on a lower surface and a side surface of the body portion 34.

In the termination region R3, for example, two of the openings 21 are formed. In this case, since an edge seal 33 is provided in each of the respective openings 21, a total of two edge seals 33 are provided. The number of the openings 21 and the number of the edge seals 33 are not limited to 2, respectively.

As illustrated in FIGS. 1 and 2, in the peripheral circuit region R2, a peripheral circuit is formed at the upper layer portion of the silicon substrate 10 and is located within the interlayer insulating film 90. As circuit elements constituting the peripheral circuit, an n-type MOSFET (Metal-Oxide-Semiconductor Field-Effect Transistor), a p-type MOSFET, a resistive element, a capacitor and the like may be formed.

Hereinafter, as one of the circuit elements, an n-type MOSFET 41 is described as an example. In the n-type MOSFET 41, the upper layer portion of the silicon substrate 10 is divided into active areas by the STI 12, and inside the active area, the p-type well 14 is formed. At an upper portion of the p-type well 14, two n$^+$-type source drain regions 16 are formed spaced from each other. In the p-type well 14, a region between the two n$^+$-type source drain regions 16 serves as a channel region, and in a region directly above the channel region, a gate stacked body 40 is provided.

In the gate stacked body 40, the silicon oxide film 23, the polysilicon film 24, the tungsten silicide film 25, the silicon nitride film 26, and the silicon nitride film 27 are sequentially stacked from down to up. Further, the sidewall 29 is provided on a side surface of the stacked body including the silicon oxide film 23, the polysilicon film 24, and the tungsten silicide film 25. Since the silicon oxide film 23, the polysilicon film 24, the tungsten silicide film 25, the silicon nitride film 26, the silicon nitride film 27, and the sidewall 29, which are provided in the peripheral circuit region R2, are formed in the same process as that of the silicon oxide film 23, the polysilicon film 24, the tungsten silicide film 25, the silicon nitride film 26, the silicon nitride film 27, and the sidewall 29, which are provided in the termination region R3, the compositions and the thicknesses of each film are approximately equal to each other.

In a region of the interlayer insulating film 90 directly above the tungsten silicide film 25 and directly above the source drain region 16, a contact 43 extending in the up and down direction is provided and is connected to the tungsten silicide film 25 and the source drain region 16. Although FIG. 2 illustrates only the contact 43 connected to the tungsten silicide film 25 through the interlayer insulating film 90, the contact 43 connected to the tungsten silicide film 25 passes through the interlayer insulating film 90, the silicon nitride film 27, and the silicon nitride film 26.

In the memory cell region R1, at the upper layer portion of the silicon substrate 10, the n-type well 13 is formed. In a portion of the upper layer portion of the n-type well 13, the p-type well 14 is formed. The p-type well 14 is provided thereon with a memory stacked body 50 thereon. In the memory stacked body 50, a plurality of electrode films 51 formed of, for example, tungsten, titanium nitride, and titanium, and a plurality of silicon oxide films 52 are alternately stacked.

Inside a center portion 50a of the memory stacked body 50, a silicon pillar 53 extending in the up and down direction is provided. The shape of the silicon pillar 53, for example, is cylindrical with a closed lower end, and a core member (not illustrated) made of silicon oxide is provided in the silicon pillar 53. Between the silicon pillar 53 and penetrated portion of the stacked by, a memory film 54 is provided. The shape of the memory film 54 is an approximately cylindrical shape. Over the center portion 50a of the memory stacked body 50, a bit line 56 is provided. The lower end of the silicon pillar 53 is connected to the silicon substrate 10, and an upper end thereof is connected to the bit line 56.

In the memory film 54, a tunnel insulating film, a charge storage film, and a block insulating film are sequentially provided from the silicon pillar 53. The tunnel insulating film is a film which normally has an insulation property, but allows a tunnel current to flow therethrough when a predetermined voltage within a range of a driving voltage of the semiconductor memory device 1 is applied. For example, the tunnel insulating film is an ONO film in which a single-layer silicon oxide film or a silicon oxide layer, a silicon nitride layer, and a silicon oxide layer are sequentially stacked. The charge storage film is a film capable of storing charge, and for example, is formed of a material (for example, silicon nitride) including a trap site of electrons. The block insulating film is a film which allows no current to actually flow therethrough even if a voltage within the range of the driving voltage of the semiconductor memory device 1 is applied, and for example, is a multilayer film in which a single-layer silicon oxide film or a silicon oxide layer, and a high dielectric constant layer such as an aluminum oxide layer are stacked.

The memory film 54 including the charge storage film is provided around the silicon pillar 53, so that the charge storage film is disposed between the silicon pillar 53 and the electrode films 51 and a memory cell transistor is formed at each intersection between the silicon pillar 53 and the electrode films 51. Therefore, for one silicon pillar 53, a plurality of memory cell transistors are spaced from one another along the up and down direction and are serially connected to one another by the silicon pillar 53. Further, since a plurality of silicon pillars 53 extend though the stacked body 50 are spaced from one another in the center portion 50a of the memory stacked body 50, such that the memory cell transistors are three-dimensionally arranged in the center portion 50a. The charge storage film may be formed of a conductive material such as polysilicon. In this case, the charge storage film is separated for each electrode film 51.

The shape of an end portion 50b of the memory stacked body 50 is a stepwise shape, and a terrace T is formed for each electrode film 51 on which a portion of the electrode film 51 is exposed. The interlayer insulating film 90 is also disposed on the end portion 50b to cover the end portion 50b and the exposed electrode films 51. In a region of the interlayer insulating film 90 directly above the terrace T, contacts 63 extending in the up and down direction are provided. The contacts 63 pass through the interlayer insulating film 90 to contact with one of the electrode films 51 in the terrace T.

Since the contacts 63 provided in the memory cell region R1, the contact 43 provided in the peripheral circuit region R2, and the edge seals 33 provided in the termination region R3 are formed in the same process, their configurations are approximately equal to one another. That is, on the lower surface and the side surface of the body portion 34 made of, for example, tungsten, the barrier metal layer 35 in which, for example, a titanium nitride layer and a titanium layer are stacked is formed.

Next, a manufacturing method of the semiconductor memory device 1 according to the embodiment is described.

As illustrated in FIGS. 1 to 3, a silicon wafer as the silicon substrate 10 is prepared, and the STI 12, the n-type well 13, and the p-type well 14 are formed at the upper layer portion thereof. Next, a thermal oxidation process is performed to form the silicon oxide film 23 on the upper surface of the silicon substrate 10. Next, the polysilicon film 24 and the tungsten silicide film 25 are formed. In this way, on the entire surface of the silicon substrate 10, the stacked body formed of the silicon oxide film 23, the polysilicon film 24, and the tungsten silicide film 25 are formed.

Next, portions of the stacked body are selectively removed through patterning. In this way, the stacked body is removed from the memory cell region R1. Further, in the peripheral circuit region R2, the lower portion of the gate stacked body 40 is formed. Moreover, in the termination region R3, the opening 21 is formed.

Next, for example, the thermal oxidation process is performed to form the silicon oxide film 28 in an exposed region of the upper surface of the silicon substrate 10. Next, for example, silicon nitride is deposited by a CVD (Chemical Vapor Deposition) method and is etched, so that the sidewall 29 is formed. Next, impurities are ion-implanted using the termination stacked body 20, the gate stacked body 40 and the like as a mask, so that the $p^+$-type contact layer 15 is formed. Further, impurities are ion-implanted using the gate stacked body 40 as a mask, so that the source drain regions 16 are formed in a region interposed between the upper region of the p-type well 14 and a region directly under the gate stacked body 40.

Next, silicon nitride is deposited to form the silicon nitride film 26. Next, silicon nitride is deposited and a planarization process such as CMP (Chemical Mechanical Polishing) is performed using the silicon nitride film 26 as a polishing stop layer. In this way, the silicon oxide film 30 is formed between the stacked bodies. Next, silicon nitride is deposited to form the silicon nitride film 27. Next, the silicon nitride film 27 is selectively removed from a part of the region directly above the opening 21, so that the opening 27a is formed.

Next, the silicon oxide film 52 and a silicon nitride film (not illustrated) are alternately formed, so that the memory stacked body 50 is formed. Next, in the memory cell region R1, a resist film (not illustrated) is formed on the memory stacked body 50, and etching using the resist film as a mask and slimming of the resist film are repeated. In this way, the memory stacked body 50 is removed from the peripheral circuit region R2 and the termination region R3, so that the memory stacked body 50 remains only in the memory cell region R1. Further, in the memory cell region R1, the end portion 50b of the memory stacked body 50 is processed in a stepwise shape, so that a terrace T is formed for each silicon nitride film (not illustrated). Next, a memory hole extending in the up and down direction is formed at the center portion 50a of the memory stacked body 50, the memory film 54 is formed on an inner surface of the memory hole, and the silicon pillar 53 is formed in the memory hole. The silicon pillar 53 is formed to be connected to the silicon substrate 10.

Next, for example, silicon oxide is deposited on the entire surface of the silicon substrate by the CVD method using TEOS (Tetraethyl orthosilicate: $Si(OC_2H_5)_4$) as a material and the CMP is performed using the uppermost silicon nitride film (not illustrated) of the memory stacked body 50 as a stopper, so that the lower portion of the interlayer insulating film 90 is formed. Next, a slit (not illustrated) passing through the memory stacked body 50 is formed. Next, the silicon nitride film is replaced with the electrode films 51 via the slit. Next, an insulating member is formed in the slit. In this case, a conductive member, which is connected to the silicon substrate 10, is filled in the insulating member as required. Next, the bit line 56 is formed on the center portion 50a of the memory stacked body 50 and is connected to the silicon pillar 53. Next, silicon oxide is deposited by the CVD method using the TEOS as a material, so that the upper portion of the interlayer insulating film 90 is formed.

Next, by a lithography method and an RIE (Reactive Ion Etching) method, a trench 36, a contact hole 46, and a contact hole 66 are collectively formed in the interlayer insulating film 90.

The trench 36 is formed in a frame shape in the termination region R3, and reaches the $p^+$-type contact layer 15 by passing through the interlayer insulating film 90, the silicon oxide film 30, the silicon nitride film 26, and the silicon oxide film 28. The trench 36 is formed to pass through the opening 27a of the silicon nitride film 27, and is laterally spaced from the silicon nitride film 27.

The contact hole 46 is formed in an approximately cylindrical shape in the peripheral circuit region R2, and reaches the tungsten silicide film 25 by passing through the interlayer insulating film 90, the silicon nitride film 27, and the silicon nitride film 26.

The contact hole 66 is formed in an approximately cylindrical shape in the memory cell region R1, and reaches the electrode film 51 by passing through the interlayer insulating film 90.

Next, titanium is deposited on the entire surface and then titanium nitride is deposited, so that the barrier metal layer 35 is formed. Next, tungsten is deposited on the entire surface, so that the body portion 34 is formed. Next, by CMP, etching, and the like, the body portion 34 and the barrier metal layer 35 are removed from the upper surface of the interlayer insulating film 90 and are allowed to remain in trench 36, the contact hole 46, and the contact hole 66. In this way, the edge seal 33 is formed in the trench 36, and the contact 43 is formed in the contact hole 46, and the contact 63 is formed in the contact hole 66. Next, the silicon wafer and the structure formed thereon are subjected to dicing, so that they are cut into a plurality of individual memory chips. By so doing, the semiconductor memory device 1 according to the embodiment is manufactured.

Next, effects of the embodiment will be described.

In the embodiment, the edge seal 33 is formed in the termination region R3. The edge seal 33 contains metal, its lower end is connected to the silicon substrate 10, and its upper end reaches the upper surface of the interlayer insulating film 90. In this way, even if a crack occurs with a dicing line as a starting point during dicing of a silicon wafer, propagation of the crack is blocked by the edge seal 33, so that it is possible to prevent the crack from entering into the peripheral circuit region R2 and the memory cell region R1. Further, the edge seal 33 prevents diffusion of atmospheric moisture, so that the moisture can be prevented from intruding into the peripheral circuit region R2 and the memory cell region R1. Therefore, the semiconductor memory device 1 according to the embodiment has high reliability.

Further, in the embodiment, the trench 36 for forming the edge seal 33, the contact hole 46 for forming the contact 43, and the contact hole 66 for forming the contact 63 are collectively formed in the same process. In this way, the number of processes is reduced, so that it is possible to reduce the manufacturing cost of the semiconductor memory device 1.

In this case, in the termination region R3, since the opening 27a is previously formed in the silicon nitride film 27 at a position in which the trench 36 is to be formed, it is not necessary to etch the silicon nitride film 27 when the trench 36 is formed thereafter together with the contact holes 46 and 66. In this way, the trench 36 is formed to be deeper than the contact holes 46 and 66, so that it is possible to allow the trench 36 to reliably reach the silicon substrate 10 if the trench 36 and contact holes 46 and 66 are collectively formed.

In contrast, if the opening 27a is not formed in the silicon nitride film 27, the silicon nitride film 27 is also etched when the trench 36 is formed. In this case, since the silicon nitride film 27 is difficult to etch as compared with the interlayer insulating film 90 made of silicon oxide and the silicon oxide film 30, it is probable that a formation depth of the trench 36 will not be sufficient. Particularly, in a case where the cylindrical contact holes 46 and 66 and the linear trench 36 are simultaneously formed, when etching conditions are optimized according to the cylindrical contact holes 46 and 66, the linear trench 36 may not be sufficiently etched. Further, since the formation of the contact hole 66 needs to be stopped at the electrode film 51, excessive overetching is not preferable. As a consequence, since the trench 36 would not reach the silicon substrate 10, it is probable that the edge seal 33 will not be in contact with the silicon substrate 10. In this case, it is not possible to reliably block propagation of a crack and intrusion of moisture into the peripheral region R2 and the memory cell region R1.

In contrast, according to the embodiment, the trench 36 is formed to pass through the opening 27a, so that the silicon nitride film 27 is prevented from being interposed between the progressing trench 36 as it is being etched and the silicon substrate 10. Therefore, a trench 36 deeper than the contact holes 46 and 66 can be reliably formed to reach the silicon substrate 10.

Modification of First Embodiment

Next, a modification of the first embodiment will be described.

Figure 4:
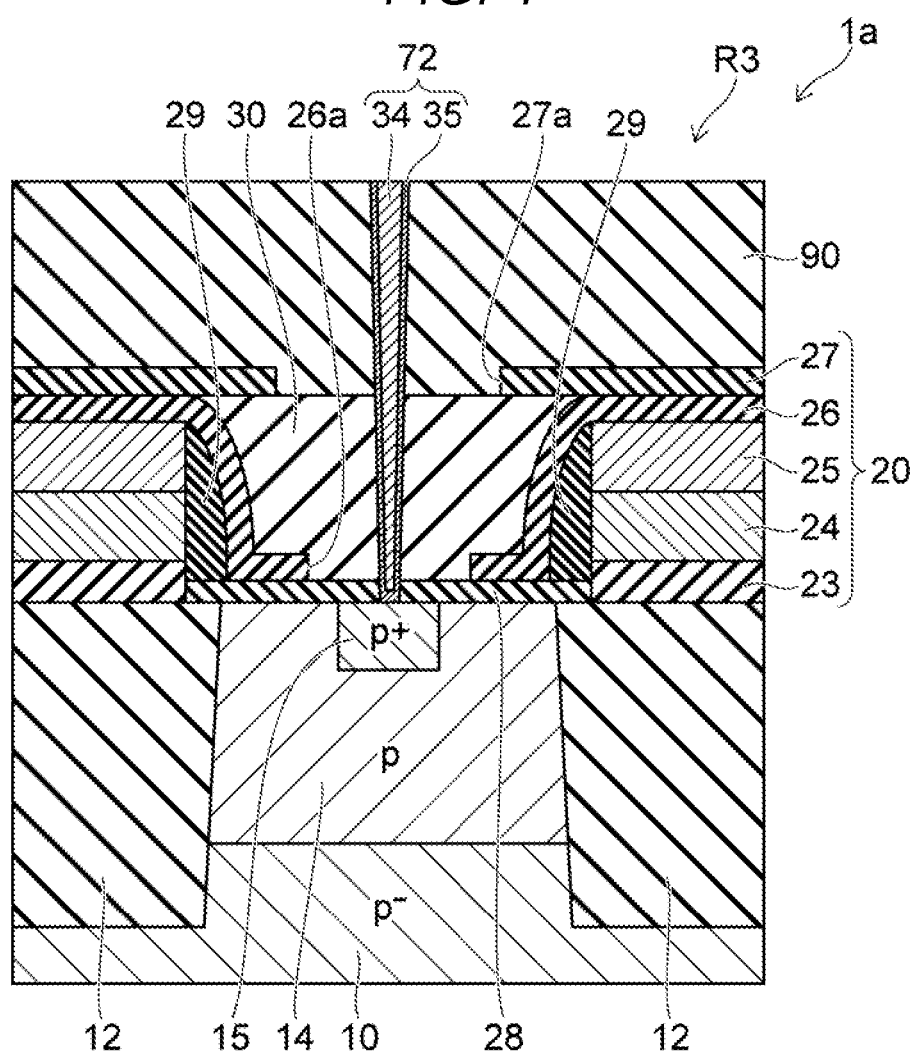
FIG. 4 is a sectional view of a semiconductor memory device according to a modification of the first embodiment.

FIG. 4 is a sectional view of a semiconductor memory device according to the modification.

FIG. 4 illustrates an area corresponding to the area B of FIG. 2.

As illustrated in FIG. 4, in a semiconductor memory device 1a according to the modification, in the termination region R3, an opening 26a is also formed in the silicon nitride film 26. The interlayer insulating film 90 extends into the opening 26a. Further, an edge seal 72 is disposed in the opening 26a and is spaced from the silicon nitride film 26.

In this modification, the silicon nitride film 26 is formed, and then, for example, by the lithography method and the RIE method, a portion of the silicon nitride film 26 is selectively removed to form the opening 26a. Then, after the overlying films are formed, the trench 36 is formed so as to pass through the opening 26a.

According to this modification, when the trench 36 is formed, since it is not necessary to etch the silicon nitride film 26, the trench 36 is formed more easily.

A configuration, a manufacturing method, and effects of the modification, except for the aforementioned description, are similar to those of the first embodiment.

Second Embodiment

Next, a second embodiment will be described.

Figure 5:
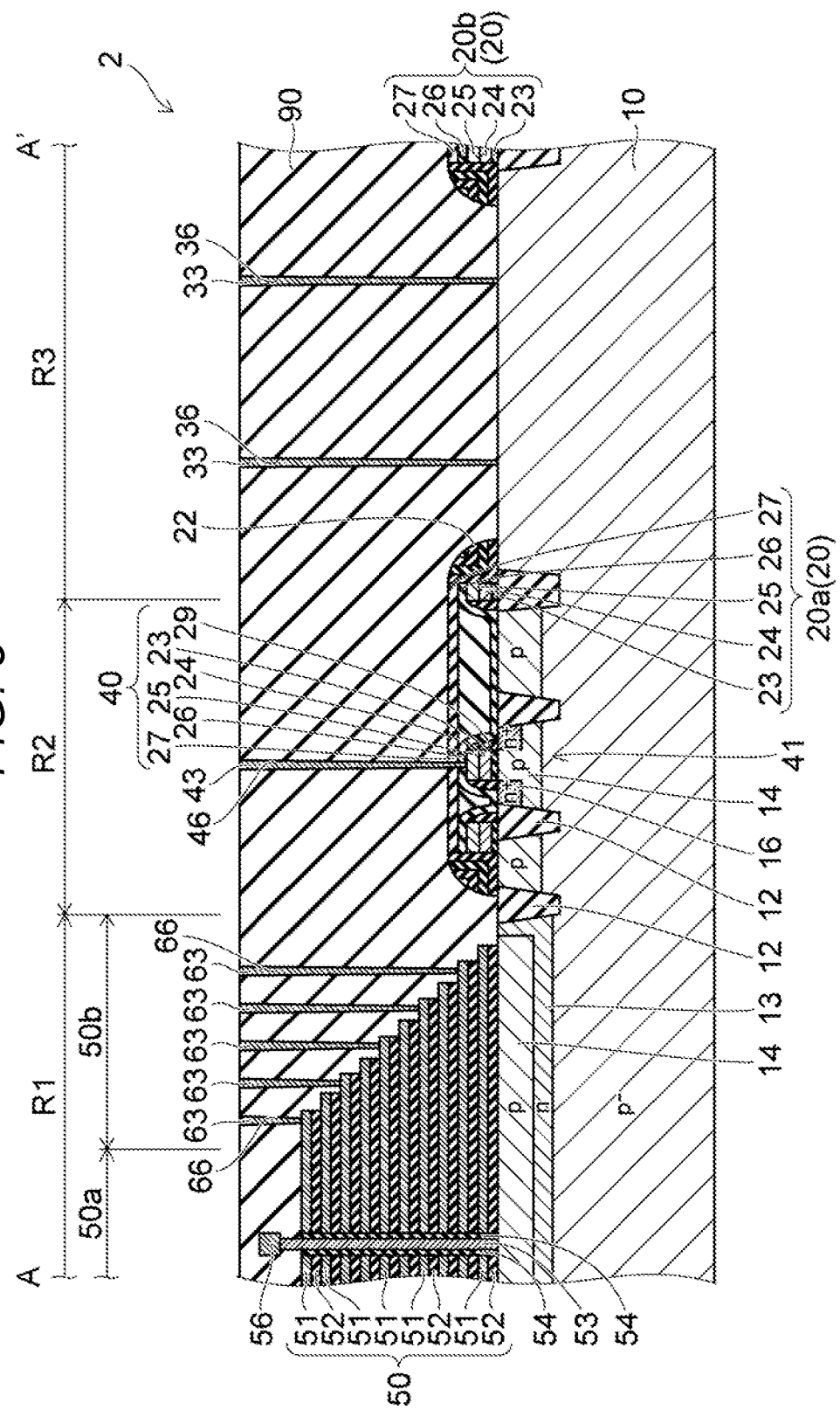
FIG. 5 is a sectional view of a semiconductor memory device according to a second embodiment.

FIG. 5 is a sectional view of a semiconductor memory device according to the embodiment.

A cross section illustrated in FIG. 5 corresponds to the cross section taken along line A-A' illustrated in FIG. 1.

As illustrated in FIG. 5, in a semiconductor memory device 2 according to the embodiment, in the termination region R3, a wide opening 22 is formed in the termination stacked body 20. When viewed from above, the shape of the opening 22 is a frame shape along the edge 10e (see FIG. 1) of the silicon substrate 10. In the opening 22, a part of the interlayer insulating film 90 is disposed. In other words, the termination stacked body 20 is separated into an inner termination stacked body 20a and an outer termination stacked body 20b while interposing the opening 22 between the inner termination stacked body 20a and the outer termination stacked body 20b.

When viewed from above, all the edge seals 33 provided in the semiconductor memory device 2, here for example, two edge seals 33, are disposed in one opening 22. The edge seals 33 pass through the interlayer insulating film 90, so that their lower ends are connected to the silicon substrate 10. In a region of the silicon substrate 10 directly under the opening 22, impurity diffusion layers such as the n-type well 13, the p-type well 14, and the p+-type contact layer 15 are not formed. Alternatively, in the region of the silicon substrate 10 directly under the opening 22, some impurity diffusion layers may be formed.

At a bottom portion of the opening 22, the silicon substrate 10 and the interlayer insulating film 90 are in contact with each other or separated by a silicon oxide film (not illustrated) necessarily formed in processing therebetween. Therefore, between the silicon substrate 10 and the interlayer insulating film 90, a material other than the silicon oxide film, for example, silicon nitride, metal and the like are not provided.

Next, a manufacturing method of the semiconductor memory device according to the embodiment and different than those used to form the device of FIG. 2 is described.

In the embodiment, in the peripheral circuit region R2, circuit elements such as the n-type MOSFET 41 are formed and the silicon nitride film 27 is formed on an entire surface. Then, in the termination region R3, the stacked body formed of the silicon oxide film 23, the polysilicon film 24, the tungsten silicide film 25, the silicon nitride film 26, and the silicon nitride film 27 is selectively removed to form the opening 22. Then, the interlayer insulating film 90 is formed, and then the trench 36, the contact hole 46, and the contact hole 66 are collectively formed in the interlayer insulating film 90.

Next, effects of the embodiment will be described.

In the embodiment, when the trench 36 is formed, since only the interlayer insulating film 90 is etched, it is not necessary to etch a material other than silicon oxide, such as for example, silicon nitride. As a consequence, the trench 36 can be deeply formed to reliably reach the silicon substrate 10.

A configuration, a manufacturing method, and effects of the embodiment, except for the aforementioned description, are similar to those of the first embodiment.

Third Embodiment

Next, a third embodiment will be described.

Figure 6:
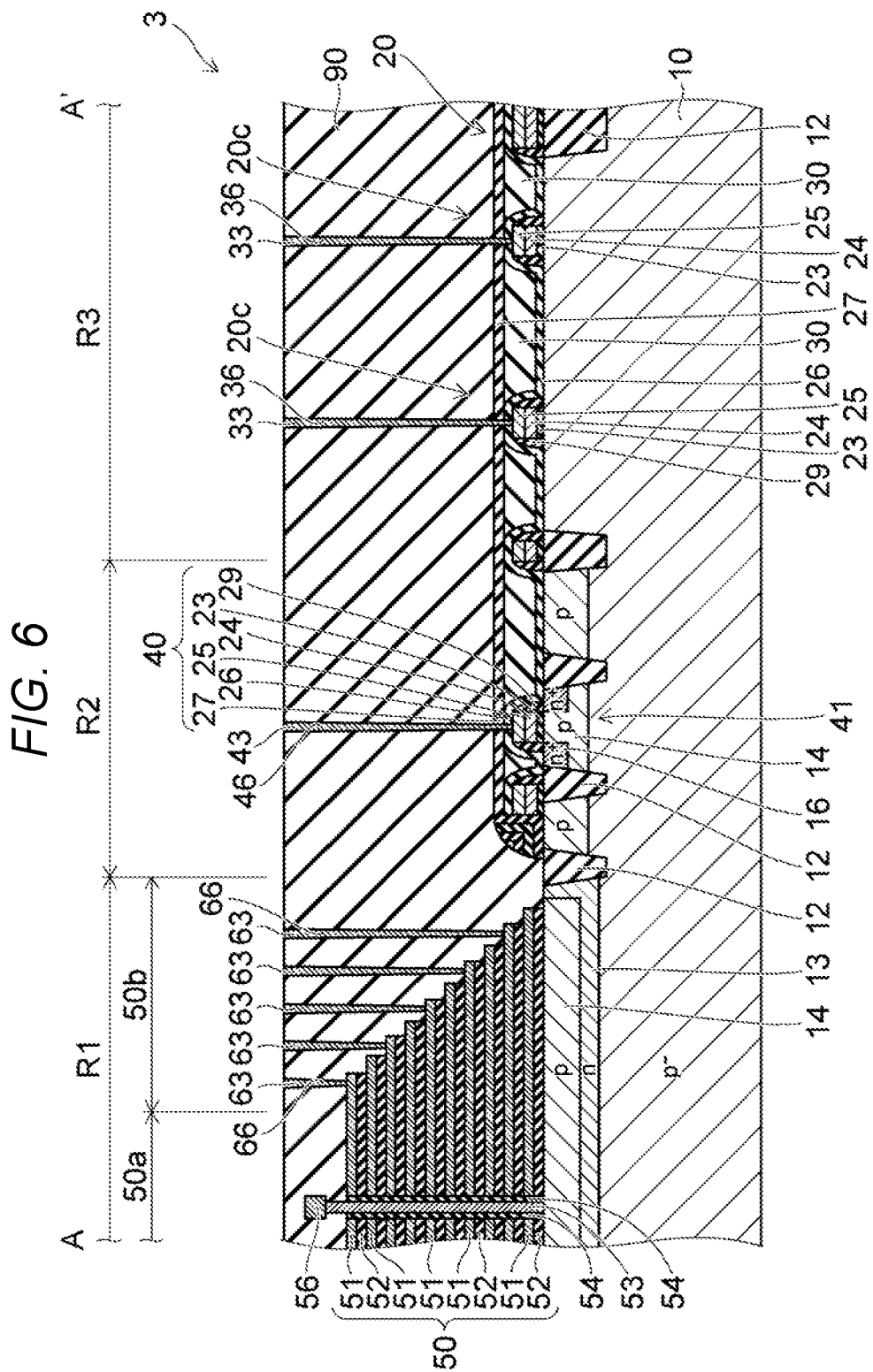
FIG. 6 is a sectional view of a semiconductor memory device according to a third embodiment.

FIG. 6 is a sectional view of a semiconductor memory device according to the embodiment.

A cross section illustrated in FIG. 6 corresponds to the cross section taken along line A-A' illustrated in FIG. 1.

As illustrated in FIG. 6, in a semiconductor memory device 3 according to the embodiment, a termination stacked body 20c is provided in a region directly under each edge seal 33. When viewed from above, the shape of the termination stacked body 20c is a frame shape extending along a location inwardly of the edge 10e (see FIG. 1) of the silicon substrate 10. Further, when viewed from above, the width of the termination stacked body 20c is wider than that of the edge seal 33.

The stack structure of the termination stacked body 20c is the same as that of the gate stacked body 40. That is, in the termination stacked body 20c, the silicon oxide film 23, the polysilicon film 24, the tungsten silicide film 25, the silicon nitride film 26, and the silicon nitride film 27 are sequentially stacked from down to up. The edge seal 33 is in contact with the tungsten silicide film 25 by passing through the interlayer insulating film 90, the silicon nitride film 27, and the silicon nitride film 26. Therefore, the lower end of the edge seal 33 in the up and down direction is approximately the same as the position of the lower end of the contact 43.

According to the embodiment, since the termination stacked body 20c is provided in the region directly under the edge seal 33, even if the position of the lower end of the edge seal 33 is higher than the upper surface of the silicon substrate 10, it is possible to form a continuous wall structure by the edge seal 33 and the termination stacked body 20c. In this way, it is possible to prevent a crack and moisture from intruding into the peripheral circuit region R2 and the memory cell region R1. Further, since it is sufficient if the trench 36 is formed to a depth equal to that of the contact hole 46, the trench 36 can be formed to be shallower as compared with the case where the termination stacked body 20c is not provided. Therefore, the trench 36 is easily formed.

A configuration, a manufacturing method, and effects of the embodiment, except for the aforementioned description, are similar to those of the first embodiment.

First Modification of Third Embodiment

Next, a first modification of the third embodiment will be described.

Figure 7:
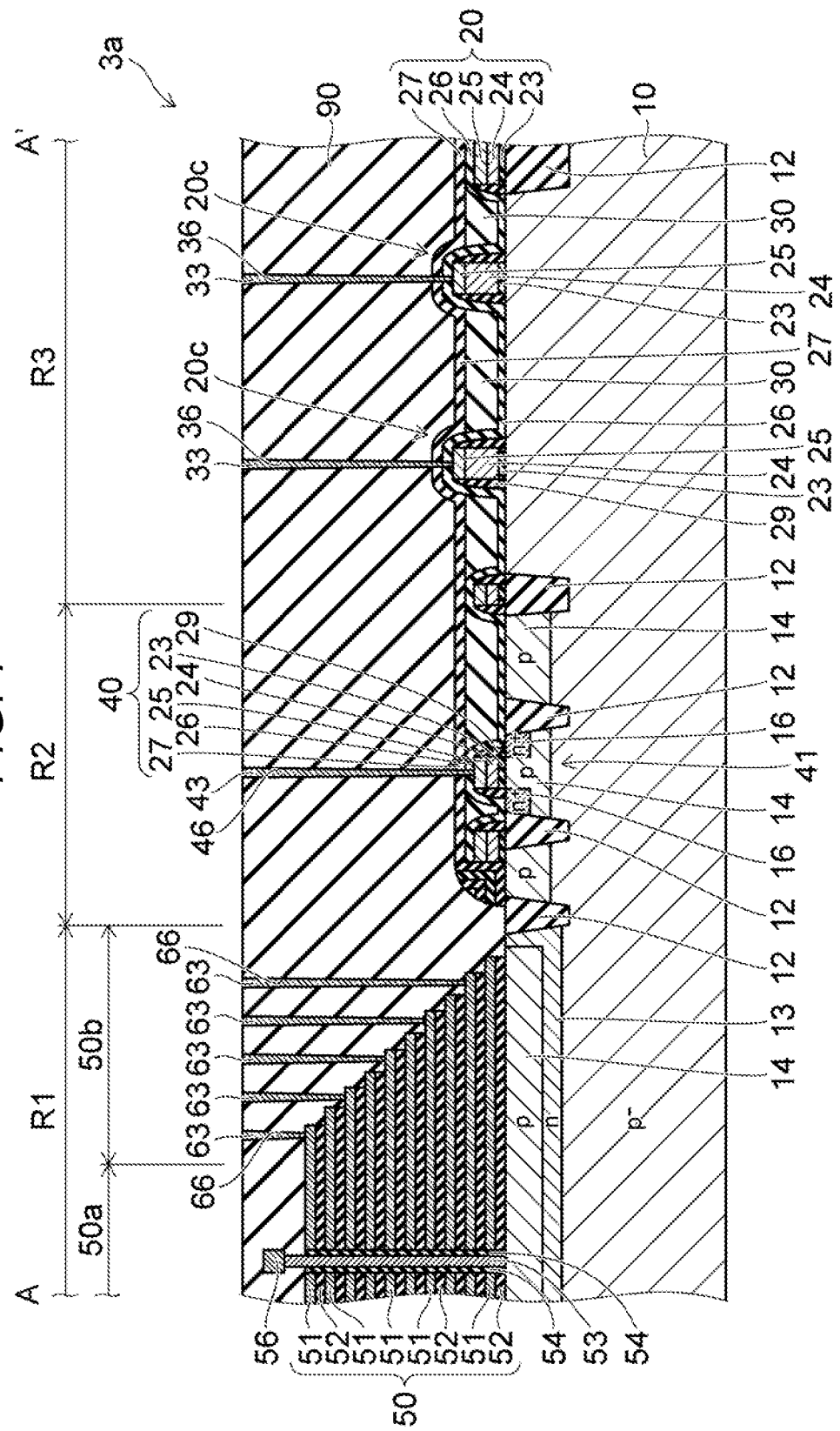
FIG. 7 is a sectional view of a semiconductor memory device according to a first modification of the third embodiment.

FIG. 7 is a sectional view of a semiconductor memory device according to the modification.

A cross section illustrated in FIG. 7 corresponds to the cross section taken along line A-A' illustrated in FIG. 1.

As illustrated in FIG. 7, a semiconductor memory device 3a according to the embodiment is different from the semiconductor memory device 3 (see FIG. 6) according to the third embodiment in that the polysilicon film 24 of the termination stacked body 20c is thicker than the polysilicon film 24 of the gate stacked body 40. Therefore, the upper surface of the tungsten silicide film 25 in the termination stacked body 20c is higher than the upper surface of the tungsten silicide film 25 in the gate stacked body 40.

According to the modification, as compared with the third embodiment, the position of the lower end of the edge seal 33 can be end higher from the substrate 10, so that the trench 36 can be formed to be shallower. As a consequence, the trench 36 is easily formed.

A configuration, a manufacturing method, and effects of the modification, except for the aforementioned description, are similar to those of the third embodiment.

Second Modification of Third Embodiment

Next, a second modification of the third embodiment will be described.

Figure 8:
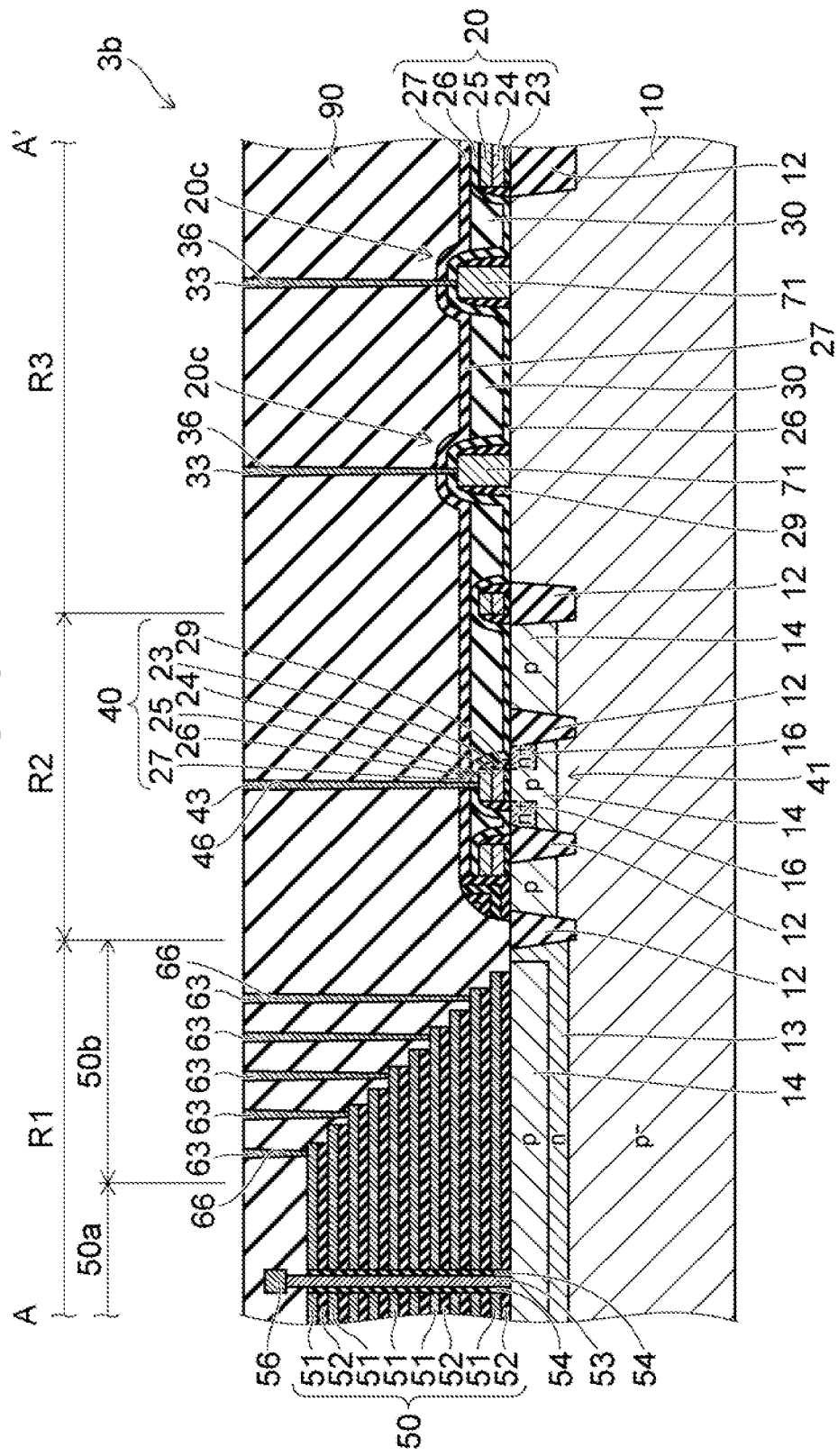
FIG. 8 is a sectional view of a semiconductor memory device according to a second modification of the third embodiment.

FIG. 8 is a sectional view of a semiconductor memory device according to the modification.

A cross section illustrated in FIG. 8 corresponds to the cross section taken along line A-A' illustrated in FIG. 1.

As illustrated in FIG. 8, a semiconductor memory device 3b according to the embodiment is different from the semiconductor memory device 3a (see FIG. 7) according to the first modification of the third embodiment in that a frame shaped member 71 is provided instead of the termination stacked body 20c. When viewed from above, the shape of the frame shaped member 71 is a rectangular frame shape similar to that of the termination stacked body 20c, and its width is wider than that of the edge seal 33.

The frame shaped member 71, for example, is formed of a single material. For example, the frame shaped member 71 is formed of a conductive material such as tungsten, titanium nitride, and polysilicon, or an insulating material such as silicon nitride. Similarly to the edge seal 33, the frame shaped member 71 may be provided with a body portion made of tungsten and a barrier metal layer provided on a lower surface and a side surface of the body portion.

A configuration, a manufacturing method, and effects of the modification, except for the aforementioned description, are similar to those of the first modification of the third embodiment.

Fourth Embodiment

Next, a fourth embodiment will be described.

Figure 9:
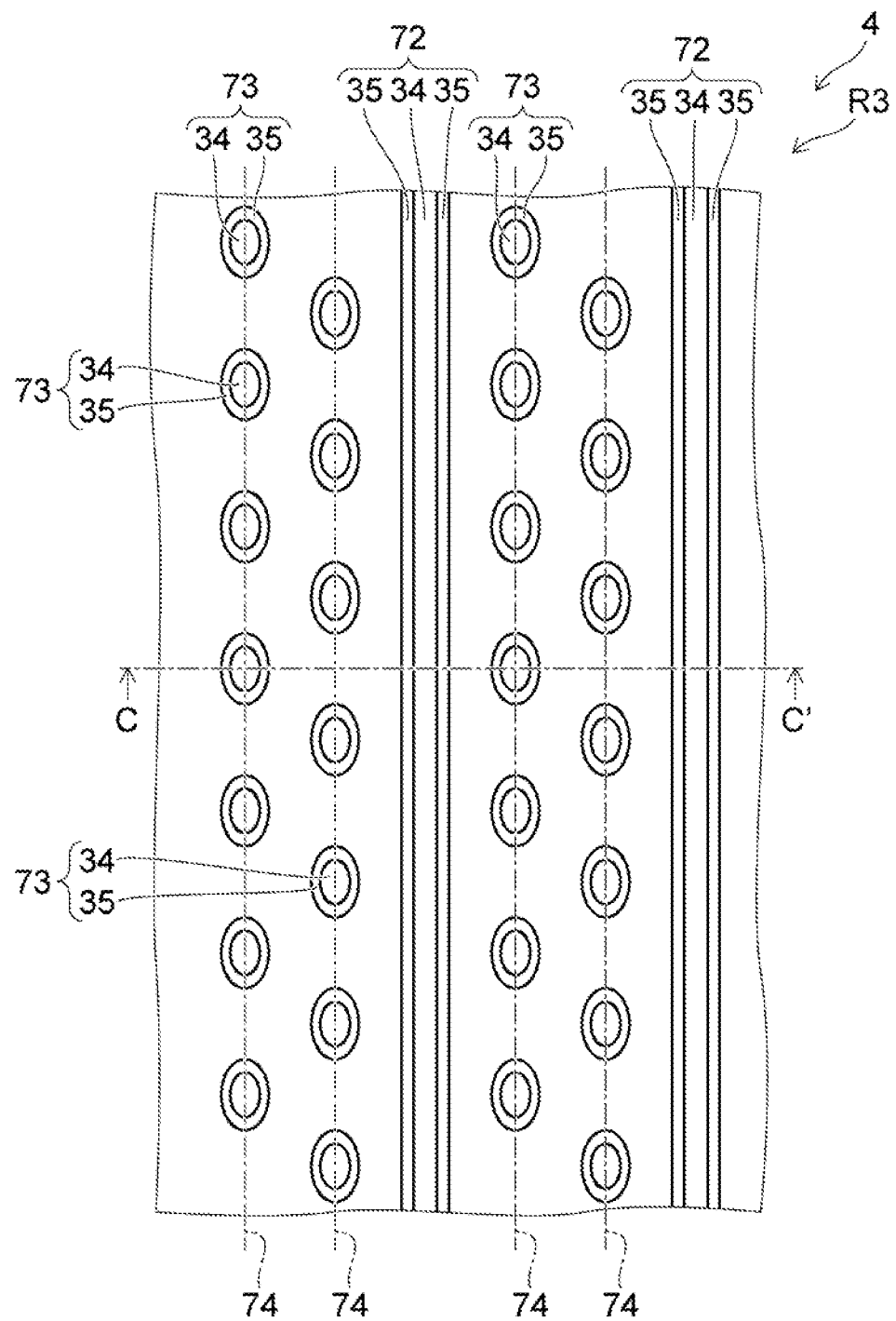
FIG. 9 is a sectional view of a semiconductor memory device according to a fourth embodiment.

FIG. 9 is a plan view of a semiconductor memory device according to the embodiment.

Figure 10:
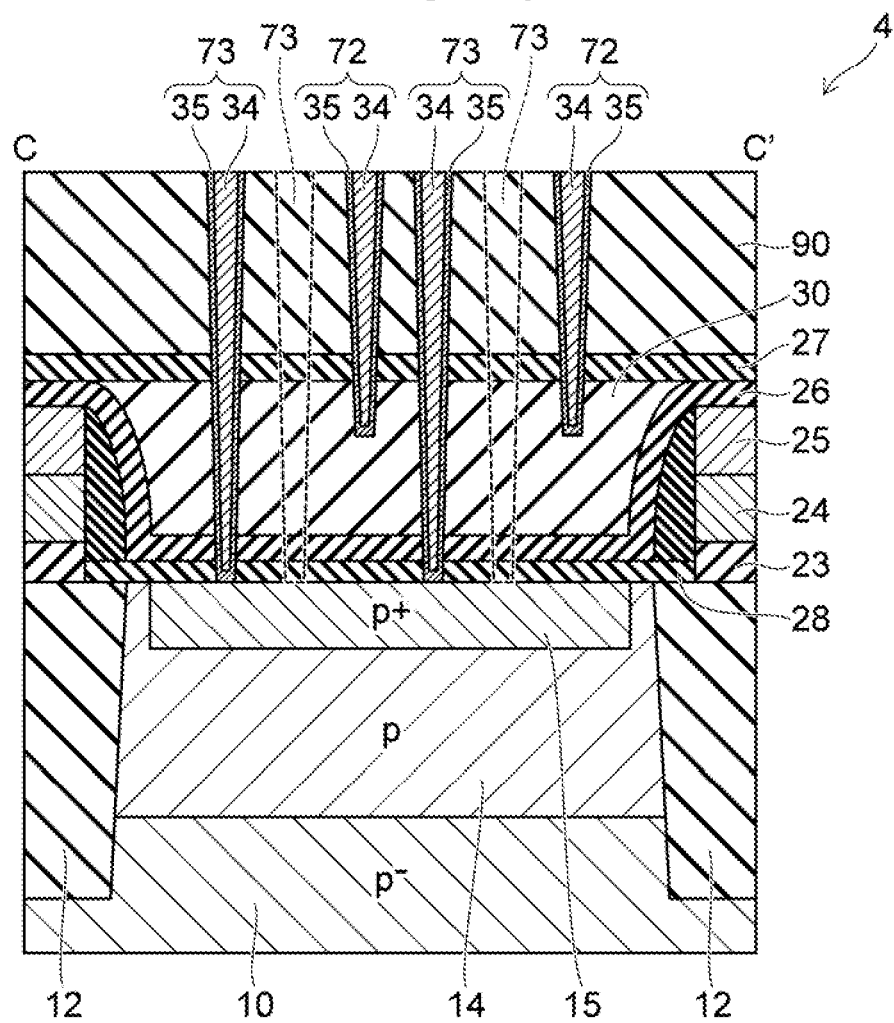
FIG. 10 is a sectional view taken along line C-C' illustrated in FIG. 9.

FIG. 10 is a sectional view taken along line C-C' illustrated in FIG. 9.

As illustrated in FIGS. 9 and 10, a semiconductor memory device 4 according to the embodiment is different from the semiconductor memory device 1 (see FIGS. 1 to 3) according to the first embodiment in that a plurality of edge seals 72, and a plurality of edge seal 73 are provided as individual pillars extending along and inwardly of the edge 10e of the substrate 10 as the edge seal 33. The number of the provided edge seals 72, for example, is 2. When viewed from above, the shape of an edge seal 72 is a rectangular frame shape along and inwardly of the edge 10e (see FIG. 1) of the silicon substrate 10, and is a line shape when viewed locally. It is noted that the lower end the edge seal 72 does not reach the silicon substrate 10 and is separated from the silicon substrate 10.

On the other hand, the shape of the edge seals 73 is an approximately columnar shape, and for example, is an approximately elliptical cylindrical shape, an approximately long cylindrical shape, or an approximately right cylindrical shape, in section. A plurality of the edge seals 73 is provided. The edge seal 73 reaches the silicon substrate 10 and is connected to the silicon substrate 10. When viewed from above, the edge seals 73 are arranged along a plurality of frame shaped columns 74 along the edge 10e of the silicon substrate 10. The edge seals 73 are arranged in a staggered shape. That is, between adjacent columns 74, the positions of the edge seals 73 along the columns 74 are different from one another. For example, the edge seals 73 are arranged such that there is no straight line which is a virtual straight line extending in a horizontal direction and reaches inside the peripheral circuit region R2 from an exterior of the semiconductor memory device 4 without passing through any edge seals 73.

The film layer configuration of each of the edge seals 72 and 73 is similar to that of the edge seal 33 (see FIG. 3) in the first embodiment. That is, for example, the barrier metal layer 35 with the stacked titanium nitride layer and titanium layer is provided on the lower surface and the side surface of the body portion 34 made of tungsten.

Next, effects of the embodiment will be described.

In the embodiment, the shape of the edge seal 73 is a columnar shape. Therefore, the shape of a hole for forming the edge seal 73 is a hole shape similarly to the contact holes 46 and 66. Accordingly, by etching conditions optimized for forming the contact holes 46 and 66, it is also possible to precisely form a hole for forming the edge seal 73. As a consequence, the edge seal 73 can be allowed to reach the silicon substrate 10. In this way, it is possible to perform thorough protection in the up and down direction.

Further, in the embodiment, the edge seals 73 are arranged in a staggered shape. Therefore, it is highly probable that edge seals 73 will be interposed on a path to the peripheral circuit region R2 from a side surface of the semiconductor memory device 4. In this way, it is possible to effectively prevent a crack and intrusion of moisture into the memory chip. Particularly, when a plurality of edge seals 73 is arranged such that there is no straight line which is a virtual straight line extending in the horizontal direction and reaches inside the peripheral circuit region R2 from an exterior of the semiconductor memory device 4 without passing through any edge seals 73, it is possible to perform more thorough protection.

Moreover, in the embodiment, the frame shaped edge seal 72 is provided. Both the columnar edge seal 73 and the frame shaped edge seal 72 are provided, so that it is possible to more effectively protect an interior of the semiconductor memory device 4.

A configuration, a manufacturing method, and effects of the embodiment, except for the aforementioned description, are similar to those of the first embodiment.

According to the embodiments described above, it is possible to provide semiconductor memory devices with low manufacturing cost.

While certain embodiments have been described, these embodiments have been presented by way of example only, and are not intended to limit the scope of the inventions. Indeed, the novel embodiments described herein may be embodied in a variety of other forms; Further, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate comprising a termination region surrounding a device region thereof, the termination region comprising a first stacked body extending around the device region and including a first layer composed of an insulating material located on a surface of the semiconductor substrate, a second layer composed of a conductive material located over the first layer, and a third layer composed of an insulating material located over the second layer;

an opening extending through the first stacked body and extending around the device region;

a fourth layer, composed of an insulating material, located in the opening in the first stacked body and over the surface of the semiconductor substrate in the opening;

a fifth layer, composed of an insulating material, located over the fourth layer; and a wall surrounding the device region, the wall extending inwardly of the opening and contacting one of the surface of the semiconductor substrate or a nitride material on the surface of the semiconductor substrate, wherein the composition of the third and fifth layers is different from that of the first and fourth layers.

2. The semiconductor memory device according to claim 1, wherein the wall extends through the fifth layer.

3. The semiconductor memory device according to claim 1, wherein the fourth layer further comprises an opening therethrough exposing the surface of the semiconductor substrate therein, and the fifth layer extends inwardly of the opening in the fourth layer, and portions of the fifth layer are interposed between both sides of the wall and adjacent portions of the fourth layer.

4. The semiconductor memory device of claim 1, further comprising a sixth layer, composed of an insulating material, interposed between the fifth layer and a sidewall of the opening in the first stacked body.

5. The semiconductor memory device according to claim 4, further comprising a seventh layer, composed of an insulating material, overlying the fifth layer.

6. The semiconductor memory device according to claim 5, further comprising an eighth layer, composed of an insulating material, overlying the fifth layer and at least portions of the fifth layer.

7. The semiconductor memory device according to claim 6, wherein the wall is spaced from the portion of the eighth layer adjacent thereto.

8. The semiconductor memory device according to claim 1, wherein the device region includes a memory cell region and a peripheral region interposed between the memory cell region and the termination region, and a second stacked body, having the same composition as the first stacked body, is located in the peripheral region.

9. The semiconductor memory device according to claim 8, further comprising:

a third stacked body comprising a plurality of ninth layers composed of a conductive material stacked one over the other, and located in the device region, wherein an end of the third stacked body includes a stepped portion and portions of individual ones of the ninth layers are not covered by overlying ninth layers.

10. The semiconductor device according to claim 8, wherein the eighth layer extends over the second stacked body, and a conductive first contact extends therethrough and contacts the second stacked body in the termination region.

11. The semiconductor device according to claim 9, further comprising:

a semiconductor member passing through the third stacked body and connected to the semiconductor substrate;

a charge storage member provided between the semiconductor member and the ninth layers; and a conductive second contact contacting a ninth layer at the stepped portion of the third stacked body.

* * * * *